(12) United States Patent
Tsai

(10) Patent No.: US 9,290,374 B2
(45) Date of Patent: Mar. 22, 2016

(54) MICRO-ELECTRO-MECHANICAL SYSTEM DEVICE HAVING DIFFERENTIAL CAPACITORS OF CORRESPONDING SIZES

(71) Applicant: Ming-Han Tsai, Hsin-Chu (TW)

(72) Inventor: Ming-Han Tsai, Hsin-Chu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 0 days.

(21) Appl. No.: 14/450,074

(22) Filed: Aug. 1, 2014

(65) Prior Publication Data

US 2015/0069538 A1    Mar. 12, 2015

(30) Foreign Application Priority Data

Sep. 11, 2013  (TW) .............................. 102132809 A

(51) Int. Cl.
*B81B 3/00* (2006.01)
*H01L 29/84* (2006.01)

(52) U.S. Cl.
CPC ............. *B81B 3/0086* (2013.01); *B81B 3/0021* (2013.01)

(58) Field of Classification Search
CPC .................. H01L 23/5223; H01L 2924/1461; B81B 3/0072; B81B 3/0021; B81B 3/0086; B81B 2203/0118
See application file for complete search history.

(56) References Cited

U.S. PATENT DOCUMENTS

| 8,117,919 B2* | 2/2012 | Wang .................... B81B 3/0072 367/181 |
| 8,952,463 B2* | 2/2015 | Wang ...................... B81B 3/001 257/414 |
| 2010/0116055 A1* | 5/2010 | Lee ..................... B81C 1/00246 73/514.32 |

* cited by examiner

*Primary Examiner* — Latanya N Crawford
(74) *Attorney, Agent, or Firm* — Tung & Associates

(57) ABSTRACT

The invention provides a micro-electro-mechanical device having differential capacitor of corresponding sizes, which includes a substrate; a top fixed electrode; a bottom fixed electrode; a mass, having a top electrode and a bottom electrode, wherein the top electrodes form a top capacitor with the top fixed electrode and the bottom electrodes form a bottom capacitor with the bottom fixed electrode; a top fixed electrode extension wall having an upper end connected to the top fixed electrode and a lower end connected to the substrate; and a bottom fixed electrode extension wall having a lower end connected to the substrate through the bottom electrode, wherein the bottom fixed electrode extension wall has no upper end connected to the top fixed electrode, and total areas of the top fixed electrode extension wall and the top fixed electrode facing the mass are substantially equal to total areas of the bottom fixed electrode extension wall and the bottom fixed electrode facing the mass.

9 Claims, 8 Drawing Sheets

MICRO-ELECTRO-MECHANICAL SYSTEM DEVICE HAVING DIFFERENTIAL CAPACITORS OF CORRESPONDING SIZES

CROSS REFERENCE

The present invention claims priority to TW 102132809, filed on Sep. 11, 2013.

BACKGROUND OF THE INVENTION

1. Field of Invention

The present invention relates to a micro-electro-mechanical system (MEMS) device, especially a MEMS device wherein a top fixed electrode thereof has an extension wall and a bottom fixed electrode thereof has an extension wall, and a total surface area of the top fixed electrode extension wall facing amass and a total surface area of the bottom fixed electrode extension wall facing the mass are substantially equivalent.

2. Description of Related Art

One kind of MEMS device is out-of-plane sensors for sensing an out-of-plane movement. FIG. 1A shows a prior art MEMS out-of-plane sensor 10. The MEMS out-of-plane sensor 10 includes a seesaw 11 having a pivot P. When the MEMS device 10 moves alone a direction A, the seesaw 11 will swing because the pivot P leans to one side of the seesaw 11. A top electrode E13 disposed above the seesaw 11 and two bottom electrodes E11 and E12 on the substrate 12 form a differential capacitor pair. The displacement of the movement can be calculated according to the differential capacitance of the differential capacitor pair (the capacitance of one capacitor increases and the capacitance of the other capacitor decreases). This prior art has a drawback that it requires a precise seesaw structure which is difficult in manufacture.

FIG. 1B shows another prior art MEMS out-of-plane sensor 20 which includes a mass 21, disposed above a substrate 22 and connected to springs through anchors P. A top electrode E23 on the mass 21 and two bottom electrodes E21 and E22 forms two variable capacitors (moving in the same direction). When the out-of-plane sensor 20 moves alone the direction A, the capacitances of the two variable capacitors will increase or decrease simultaneously. This prior art has a relatively lower sensitivity because it does not use a differential capacitor pair as the previous prior art.

FIG. 1C shows another prior art MEMS out-of-plane sensor 30 which intends to improve the prior art MEMS devices of FIGS. 1A and 1B. The MEMS out-of-plane sensor 30 includes a mass 31 including a top electrode E32 and a bottom electrode E31. The top electrode E32 and a top fixed electrode E34 form a top capacitor Ctop, and the bottom electrode E31 and a bottom fixed electrode E33 form a bottom capacitor Cbot. The MEMS out-of-plane sensor 30 has a differential capacitor structure. When the MEMS out-of-plane sensor 30 moves alone the direction A, the capacitances of the top capacitor Ctop and the bottom capacitor Cbot will change in an opposite way. However, besides the top bottom capacitor Ctop and the bottom capacitor Cbot, the extension wall W between the top fixed electrode E34 and the substrate 32 also form a parasitic capacitor C' with the mass 31, and this extension wall W also form another parasitic capacitor C" with the bottom fixed electrode E33. The parasitic capacitors C' and C" will cause the capacitances of the top capacitor Ctop and the bottom capacitor Cbot to deviate from the desired values. Further, the capacitance deviations of the top capacitor Ctop and the bottom capacitor Cbot are not equivalent, which can cause an unacceptable sensing error in a worst case.

In view of the aforementioned deficiencies of the prior art MEMS devices, the present invention provides a MEMS device and an out-of-plane sensor which include a differential capacitor structure having a low capacitance deviation, and are easy-to-manufacture.

SUMMARY OF THE INVENTION

In one perspective, the present invention discloses a MEMS device having differential capacitors of corresponding sizes, which includes: a substrate; a top fixed electrode; a bottom fixed electrode; a mass, including a top electrode which forms a top capacitor with the top fixed electrode and a bottom electrode which forms a bottom capacitor with the bottom fixed electrode; a top fixed electrode extension wall having an upper end connected to the top fixed electrode and a lower end connected to the substrate; and a bottom fixed electrode extension wall having a lower end connected to the substrate through the bottom electrode, wherein the bottom fixed electrode extension wall is not connected to the top fixed electrode at any upper end of the bottom fixed electrode extension wall, and a total of a conductive surface area of the top fixed electrode extension wall facing the mass and a conductive surface area of the top fixed electrode facing the mass is substantially equal to a total of a conductive surface area of the bottom fixed electrode extension wall facing the mass and a conductive surface area of the bottom fixed electrode facing the mass.

In one embodiment of the present invention, a surface area of the top fixed electrode extension wall facing the mass is substantially equal to a surface area of the bottom fixed electrode extension wall facing the mass.

In one embodiment of the present invention, the top fixed electrode extension wall and the bottom fixed electrode extension wall are symmetrically disposed with respect to the mass.

In one embodiment of the present invention, the mass is disposed between the top fixed electrode extension wall and the bottom fixed electrode extension wall, or the top fixed electrode extension wall and the bottom fixed electrode extension wall are disposed inside the mass.

In one embodiment of the present invention, the MEMS device comprises a plurality of top fixed electrode extension walls and a plurality of bottom fixed electrode extension walls.

In one embodiment of the present invention, the top fixed electrode extension walls and the bottom fixed electrode extension walls are disposed at at least two opposite sides with respect to the mass, and each of the opposite sides is provided with at least one top fixed electrode extension wall and at least one bottom fixed electrode extension wall.

In one embodiment of the present invention, the upper end of the top fixed electrode extension wall includes at least one anchor for connecting to the top fixed electrode, and the upper end of the bottom fixed electrode extension wall includes at least one flange extending to a same elevation level as the anchor.

In one embodiment of the present invention, from a top view, the MEMS device includes a plurality of anchors and a plurality of flanges which are disposed at two opposite sides with respect to the mass, one anchor facing one flange.

In one embodiment of the present invention, from a top view, the MEMS device includes a plurality of anchors and a plurality of flanges which are disposed at two opposite sides with respect to the mass, and a total area of the anchor or anchors disposed at one of the two opposite sides is substantially equal to a total area of the anchor or anchors disposed at the other of the two opposite sides, or a total area of the flange or flanges disposed at one of the two opposite sides is substantially equal to a total area of the flange or flanges disposed at the other of the two opposite sides, or a total area of the anchors is substantially equal to a total area of the flanges.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, to show the interrelations between the regions and the process steps, but not drawn according to actual scale. The orientation wordings in the description such as: above, under, left, or right are for reference with respect to the drawings, but not for limiting the actual product made according to the present invention.

Figure 1A:
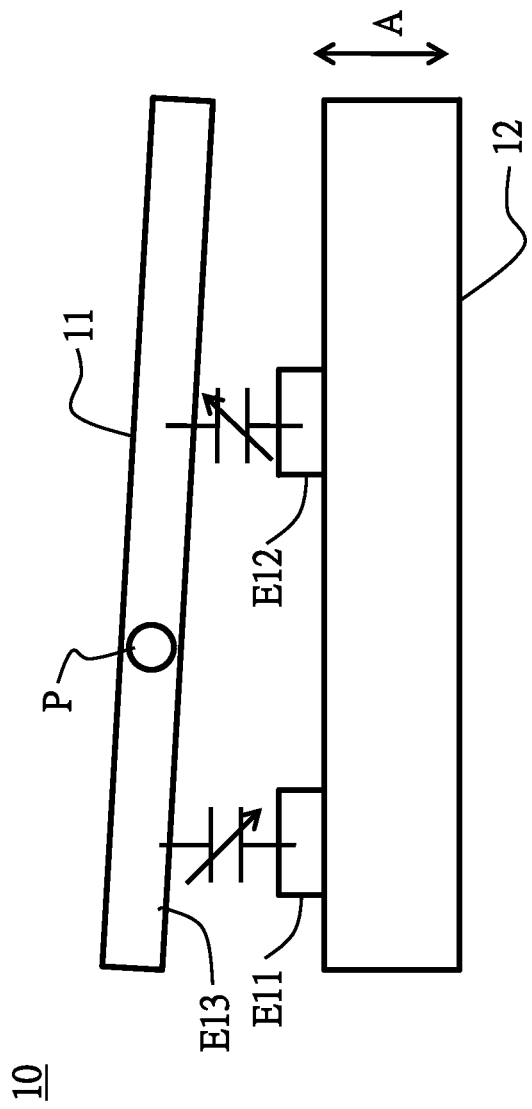
FIGS. 1A, 1B and 1C respectively show three prior art MEMS devices.
Figure 1B:
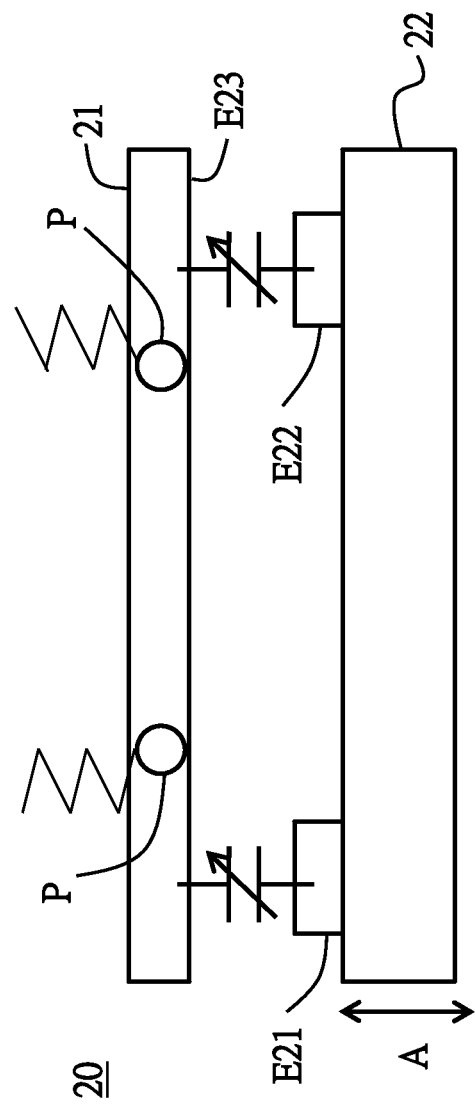
Figure 1C:
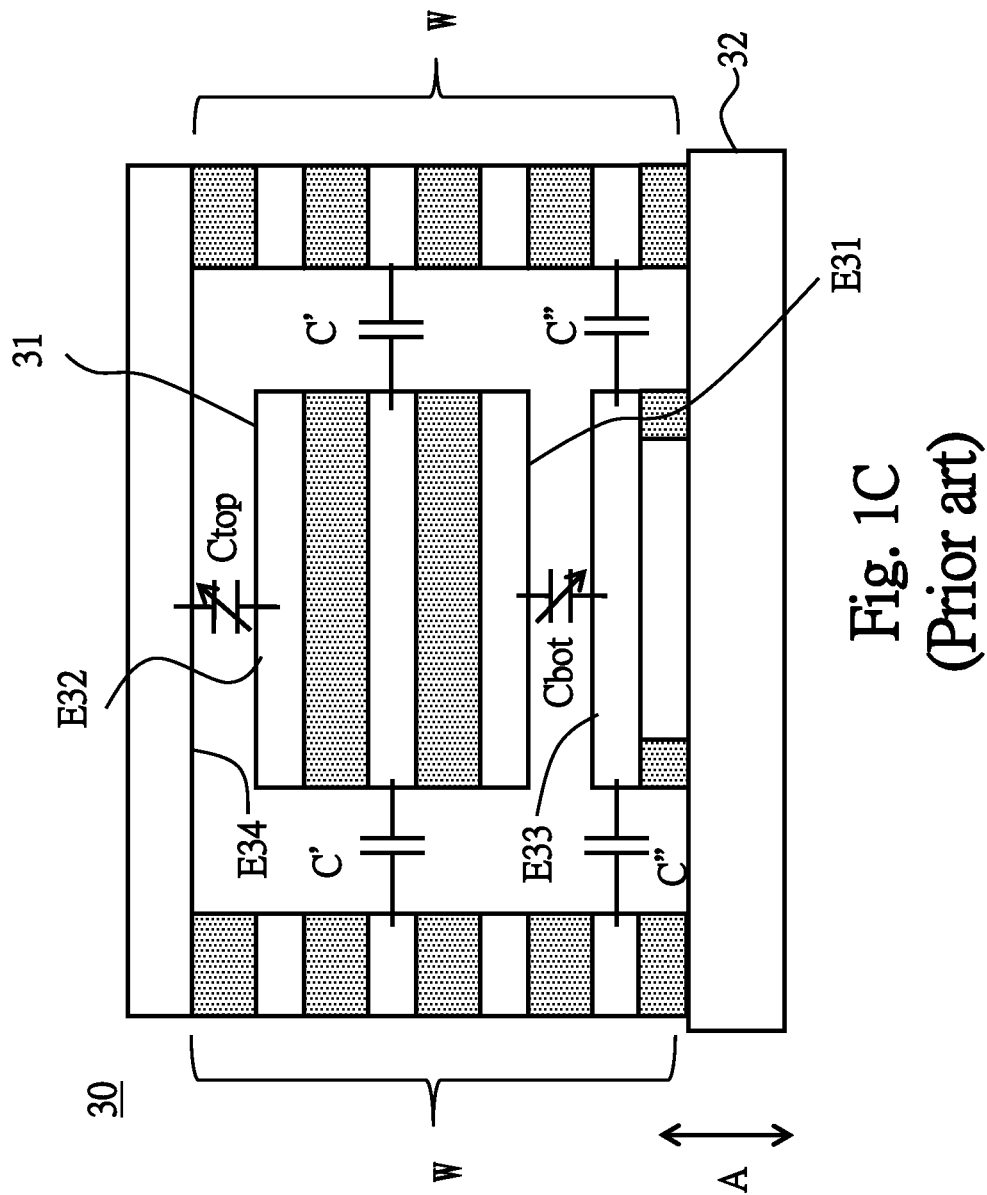
Figure 2A:
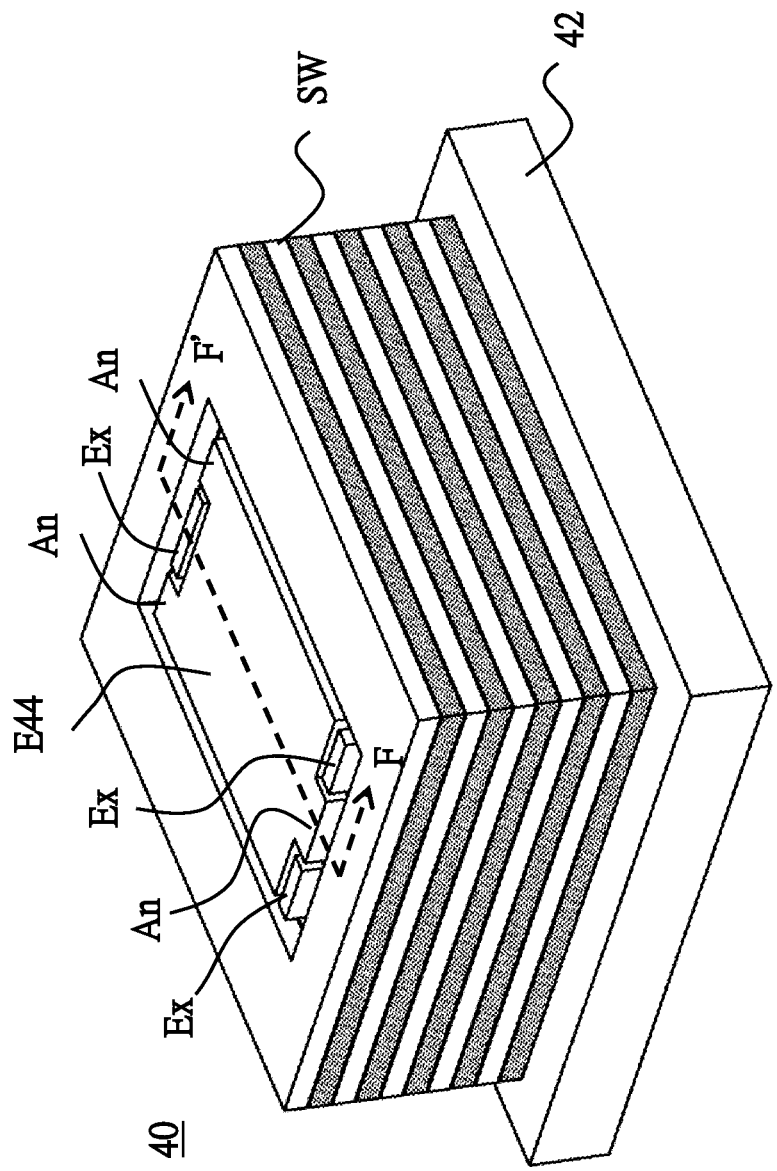
FIG. 2A shows a three-dimensional view of a MEMS device according to an embodiment of the present invention.
Figure 2B:
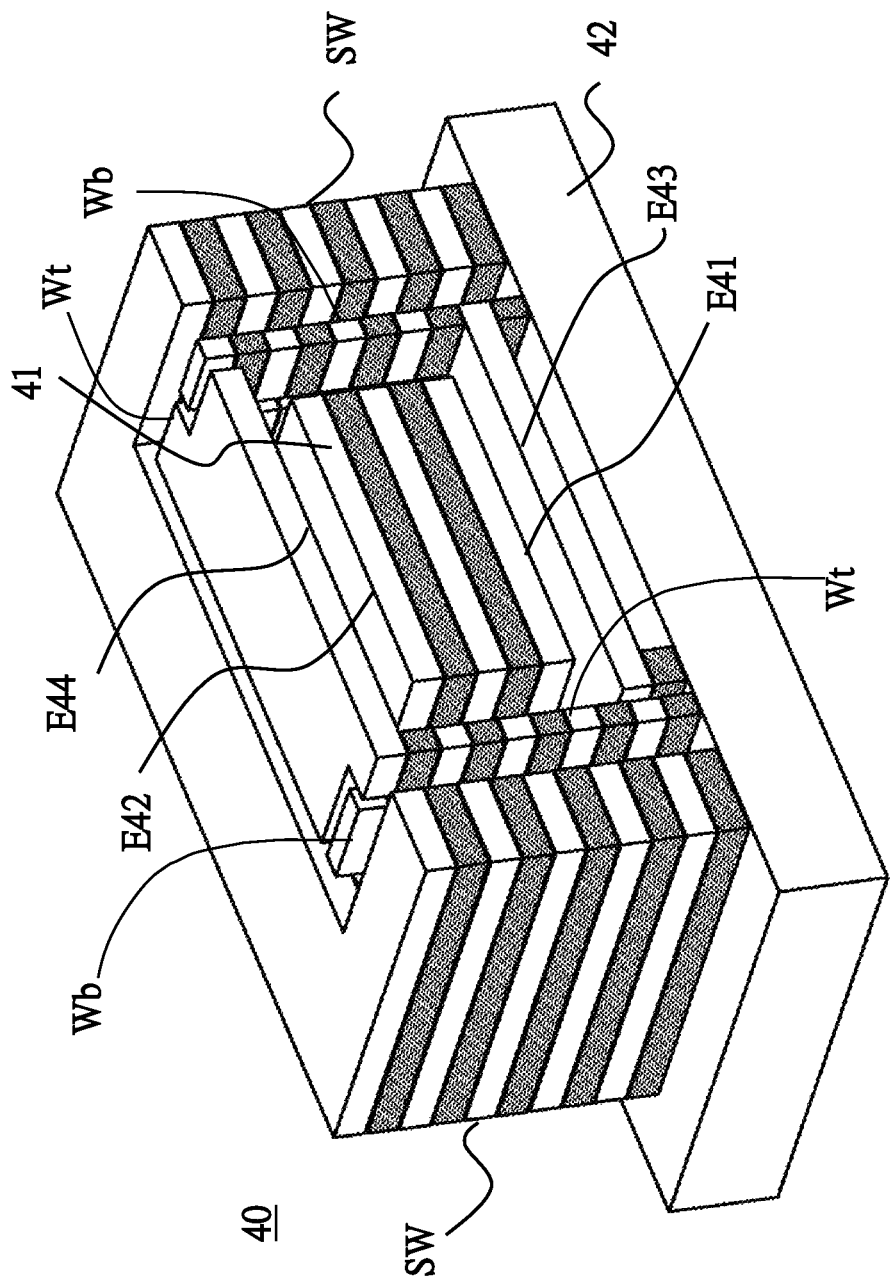
FIG. 2B shows a three-dimensional cross-section view according to the FF' cross-section line of FIG. 2A.
Figure 2C:
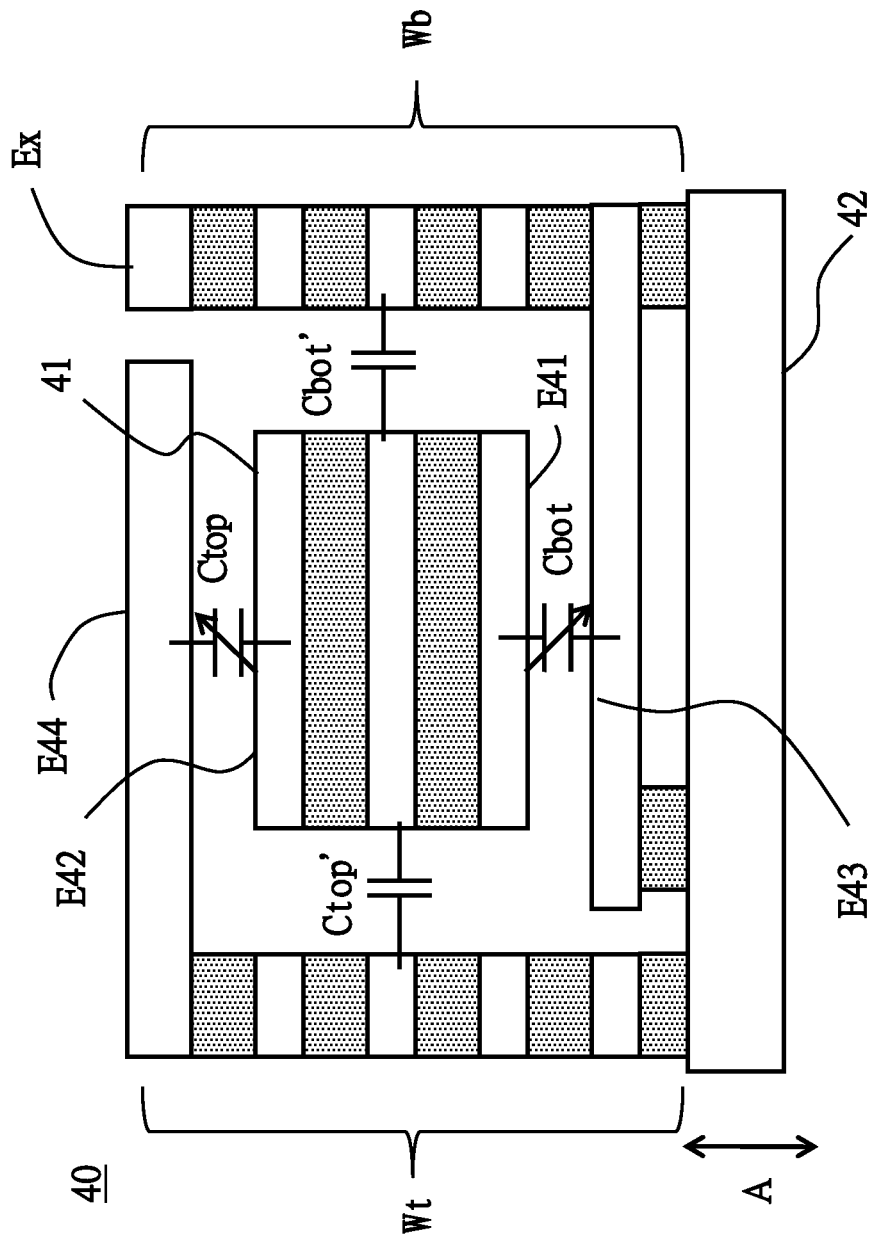
FIG. 2C shows a cross-section view according to the FF' cross-section line of FIG. 2A.

FIGS. 2A, 2B, and 2C respectively show a three-dimensional view, a three-dimensional cross-section view, and a cross-section view of a MEMS device 40 according to an embodiment of the present invention, wherein FIG. 2B shows a cross-section view according to a FF' cross-section line of FIG. 2A.

As shown in the figures, the MEMS device 40 includes a mass 41, a top fixed electrode E44, a bottom fixed electrode E43, a top fixed electrode extension wall Wt, and a bottom fixed electrode extension wall Wb. The mass 41 includes a top electrode E42 which forms a top capacitor Ctop with the top fixed electrode E44, and a bottom electrode E41 which forms a bottom capacitor Cbot with the bottom fixed electrode E43. An upper end of the top fixed electrode extension wall Wt includes at least one anchor An for connecting to the top fixed electrode E44, and a lower end of the top fixed electrode extension wall Wt is connected a substrate 42. A lower end of the bottom fixed electrode extension wall Wb is connected to the substrate 42 through the bottom electrode E43, and an upper end of the bottom fixed electrode extension wall Wb includes at least one flange Ex extending to the same elevation level as the anchor An. The bottom fixed electrode extension wall Wb is not connected to the top fixed electrode E44 at any upper end of the bottom fixed electrode extension wall Wb. A total of the conductive surface area of the top fixed electrode extension wall Wt facing the mass 41 and the conductive surface area of the top fixed electrode E44 facing the mass 41 is substantially equal to a total of the conductive surface area of the bottom fixed electrode extension wall Wb facing the mass 41 and the conductive surface area of the bottom fixed electrode E43 facing the mass 41, wherein "substantially equal to" means "having a difference within 10% and preferably within 5%", and "conductive surface area facing the mass 41" means "surface area which can effectively form a part of a capacitor with the mass 41".

Because the total conductive surface areas are substantially equal and the upper end of the bottom fixed electrode extension wall Wb is not connected to the top fixed electrode E44, the capacitance of the parasitic capacitor Ctop' formed between the mass 41 and the top fixed electrode extension wall Wt is substantially equal to the capacitance of the parasitic capacitor Cbot' formed between the mass 41 and the bottom fixed electrode extension wall Wb. Therefore, the non-equivalent parasitic capacitance problem in the prior art can be solved by the present invention. In one embodiment, a total surface area of the top fixed electrode extension wall Wt facing the mass 41 is equal to a total surface area of the bottom fixed electrode extension wall Wb facing the mass 41. Note that the number of the top fixed electrode extension wall Wt and the number of the bottom fixed electrode extension wall Wb can respectively be singular or plural. The top fixed electrode extension wall Wt and the bottom fixed electrode extension wall Wb are preferably symmetrically disposed with respect to the mass 41, for example at two opposite sides. However, the present invention is not limited to the aforementioned arrangement and can be arranged otherwise as long as the parasitic capacitors Ctop' and Cbot' have substantially equal capacitances.

When the MEMS device 40 moves alone a direction A, the top capacitor Ctop and the bottom capacitor Cbot form a differential capacitor pair; that is, when the capacitance of one capacitor increases, the capacitance of the other capacitor decreases, and the displacement of the movement can be calculated according to the differential capacitance of the differential capacitor pair.

The electrodes E41 and E42 can have the same or different voltage levels, as long as a differential capacitor pair is formed by the top capacitor Ctop and the bottom capacitor Cbot.

In one embodiment, the MEMS device 40 can be made by a CMOS manufacturing process, and FIGS. 2A, 2B, and 2C are illustrated according to the CMOS manufacturing process as an example. The bottom gray layer for example can be a contact layer of a CMOS structure or a dielectric layer at the same layer level, depending on the requirement of electric characteristic or the location of the cross-section line in the layout, and the other gray layers can be via layers or dielectric layers at the same layer levels. The white layers can be metal layers. However, certainly, it is not necessary to manufacture the MEMS device 40 by a CMOS manufacturing process; the MEMS device 40 can be made by any other manufacturing process such as an alkali process, which is well known to those skilled in this art.

The partition walls SW as shown in FIGS. 2A and 2B are for isolating the MEMS device 40 from other devices the substrate 42. However if it is not required to isolate the MEMS device 40 from other devices, the partition walls SW can be omitted.

It should be noted that there is no direct connection between the top fixed electrode extension wall Wt and the bottom fixed electrode extension wall Wb (that is, the top fixed electrode extension wall Wt and the bottom fixed electrode extension wall Wb are not shorted).

Figure 3:
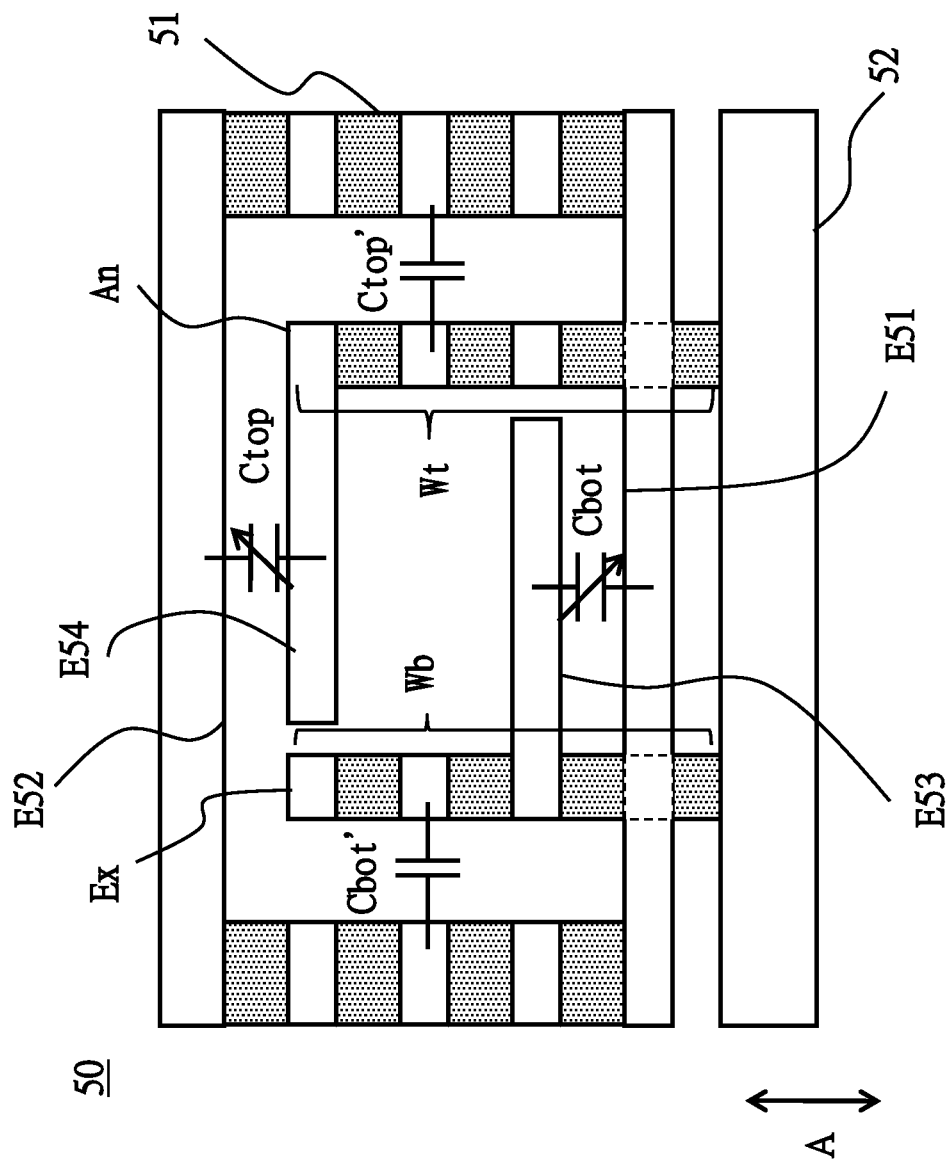
FIG. 3 shows a cross-section view of a MEMS device according to another embodiment of the present invention.

In the embodiment shown in FIGS. 2A, 2B, and 2C, the mass 41 is disposed between the top fixed electrode extension wall Wt and the bottom fixed electrode extension wall Wb. FIG. 3 shows a MEMS device 50 according to another embodiment of the present invention, wherein the mass 51 is disposed outside the top and bottom fixed electrode extension walls Wt and Wb; this arrangement is also within the spirit of the present invention. That is, the interrelationship between the mass 51 and the top and bottom fixed electrode extension walls Wt and Wb can be arranged in any way as long as the parasitic capacitors Ctop' and Cbot' have substantially equal capacitances.

In the embodiment of FIG. 3, most portions of the top and bottom fixed electrode extension walls Wt and Wb are inside of the mass 51 (there can be small portions of the top and bottom fixed electrode extension walls Wt and Wb outside the mass 51); the mass 51 can move with respect to the outer side of the top and bottom fixed electrode extension walls Wt and Wb. The mass 51 includes a top electrode E52 and a bottom electrode E51, wherein the top electrode E52 forms a top capacitor Ctop with the top fixed electrode E54, and the bottom electrode E51 forms a top capacitor Cbot with the bottom fixed electrode E53. The top fixed electrode extension wall Wt includes at least one anchor An at its upper end for connecting to the top fixed electrode E54, and the lower end of the top fixed electrode extension wall Wt is connected to the substrate 52. The bottom fixed electrode extension wall Wb is connected to the substrate 52 through the bottom electrode E53; the bottom fixed electrode extension wall Wb includes at least one flange Ex extending to the same elevation level as the anchor An. The upper end of the bottom fixed electrode extension wall Wb is not connected to the top fixed electrode E54. A total of the conductive surface area of the top fixed electrode extension wall Wt facing the mass 51 and the conductive surface area of the top fixed electrode E54 facing the mass 51 is substantially equal to a total of the conductive surface area of the bottom fixed electrode extension wall Wb facing the mass 51 and the conductive surface area of the bottom fixed electrode E53 facing the mass 51; that is, the total capacitance of the top capacitor Ctop and a parasitic capacitor Ctop' is substantially equal to the total capacitance of the bottom capacitor Cbot and a parasitic capacitor Cbot', so that the error caused by non-equivalent parasitic capacitances in the prior art can be avoided. The electrodes E51 and E52 can have the same or different voltage levels, as long as a differential capacitor pair can be formed by the top capacitor Ctop and the bottom capacitor Cbot. The rest of this embodiment is similar to the previous embodiment description.

Figure 4:
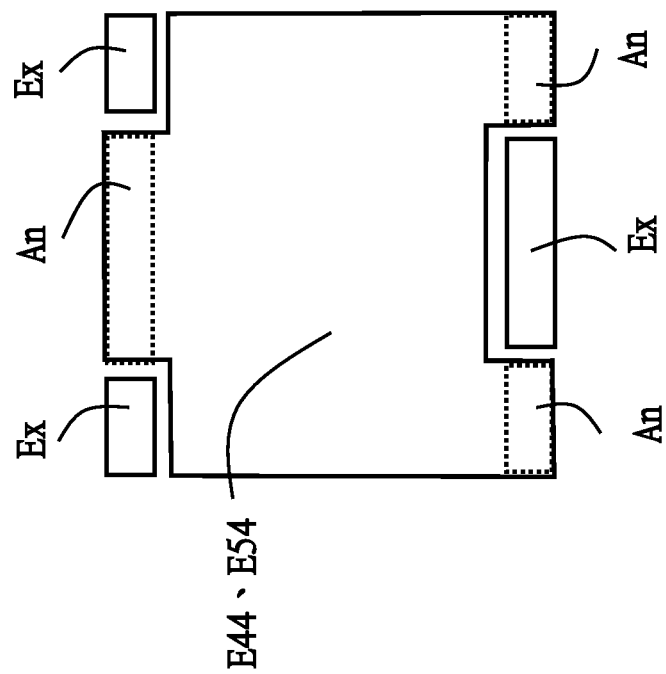
FIG. 4 shows a top view of the flanges and anchors according to an embodiment of the present invention.

For a better sensing effect, the number of the top fixed electrode extension wall Wt can be plural and the bottom fixed electrode extension wall Wb can be plural. In the embodiment of FIG. 2B, there are plural top fixed electrode extension walls Wt and plural bottom fixed electrode extension walls Wb, and there are both top fixed electrode extension walls Wt and bottom fixed electrode extension walls Wb at the same side of the mass 41. Of course, it is also practicable that there is only one of the top fixed electrode extension wall Wt and the bottom fixed electrode extension wall Wb at one side of the mass 41, and the number of the top fixed electrode extension wall Wt and the bottom fixed electrode extension wall Wb are both singular. In this embodiment, the top fixed electrode extension walls Wt and the bottom fixed electrode extension walls Wb are both provided at each of the two opposite sides of the mass 41; in this case, referring to the top view of FIG. 4 which shows a preferable embodiment, the anchors An and flanges Ex can be disposed at two opposite sides, one anchor facing one flange, and preferably, a total area of the anchor(s) at one side is substantially equal to a total area of the anchor(s) at the opposite side (as shown in the figure, the area of the upper anchor An is substantially equal to the total area of the two lower anchors An); a total area of the flange(s) at one side is substantially equal to a total area of the flange (s) at the opposite side (as shown in the figure, the total area of the upper two flanges Ex is substantially equal to the area of the lower flange Ex); and the total area of the anchors An is substantially equal to the total area of the flanges (the total area of three anchors An is substantially equal to the total area of three flanges Ex). Of course, the above is only a preferable embodiment, and the present invention is not limited to these details; it is not necessary to comply with all the aforementioned conditions.

Figure 5:
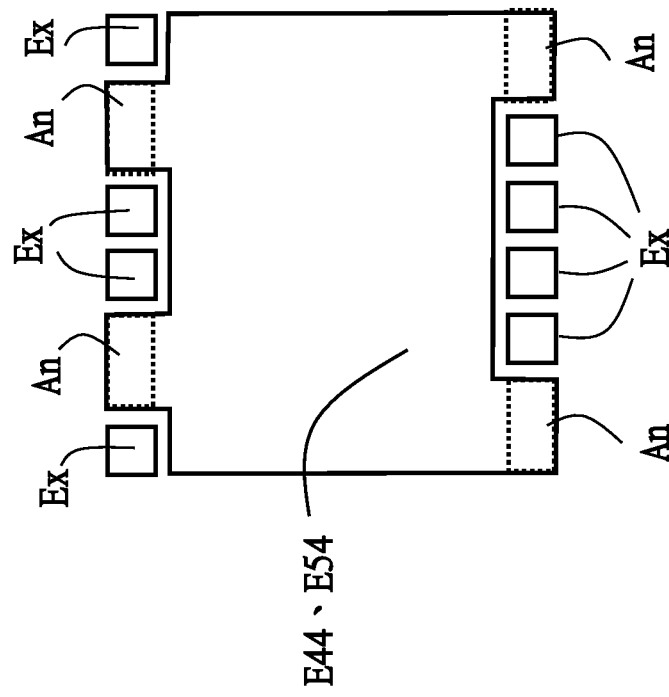
FIG. 5 shows a top view of the flanges and anchors according to another embodiment of the present invention.

For example, FIG. 5 shows another embodiment to arrange the anchors An and the flanges Ex, wherein the anchors An and the flanges Ex are not symmetrically disposed. In fact, the anchors An and the flanges Ex can be disposed by different arrangements, or the areas of the anchors An and the flanges Ex can be designed differently. The spirit of the present invention is to arrange the capacitances of the differential capacitors such that they are substantially equal to each other; that is, to counter-balance the influences from the parasitic capacitors Ctop' and Cbot'. The aforementioned embodiments of the layout of the anchors An and the flanges Ex are preferred but not to limit the implementation.

The present invention has been described in considerable detail with reference to certain preferred embodiments thereof. It should be understood that the description is for illustrative purpose, not for limiting the scope of the present invention. The abstract and the title are provided for assisting searches and not to be read as limitations to the scope of the present invention. An embodiment or a claim of the present invention does not need to attain or include all the objectives, advantages or features described in the above. Those skilled in this art can readily conceive variations and modifications within the spirit of the present invention. For example, the top and bottom fixed electrode extension walls Wt and Wb are not limited to being disposed only at two opposite sides with respect to the mass; the top and bottom fixed electrode extension walls Wt and Wb can be disposed at four sides with respect to the mass, wherein the anchors An and the flanges Ex can be disposed in a way that one anchor faces one flange. In another example, plural anchors An can be disposed on a same top fixed electrode extension wall Wt, and plural flanges Ex can be disposed on another same bottom fixed electrode extension wall Wb. Besides, the application of the present invention is not limited to the out-of-plane sensor but can be applied to other types of the sensors. Therefore, all these and other modifications should fall within the scope of the present invention.

What is claimed is:

1. A micro-electro-mechanical system (MEMS) device having differential capacitors of corresponding sizes, comprising:
    a substrate;
    a top fixed electrode;
    a bottom fixed electrode;
    a mass, including a top electrode which forms a top capacitor with the top fixed electrode and a bottom electrode which forms a bottom capacitor with the bottom fixed electrode;
    a top fixed electrode extension wall having an upper end connected to the top fixed electrode and a lower end connected to the substrate; and
    a bottom fixed electrode extension wall having a lower end connected to the substrate through the bottom electrode, wherein the bottom fixed electrode extension wall is not connected to the top fixed electrode at any upper end of the bottom fixed electrode extension wall, and a total of a conductive surface area of the top fixed electrode extension wall facing the mass and a conductive surface area of the top fixed electrode facing the mass is substantially equal to a total of a conductive surface area of the bottom fixed electrode extension wall facing the mass and a conductive surface area of the bottom fixed electrode facing the mass.

2. The MEMS device having differential capacitors of corresponding sizes of claim 1, wherein a surface area of the top fixed electrode extension wall facing the mass is substantially equal to a surface area of the bottom fixed electrode extension wall facing the mass.

3. The MEMS device having differential capacitors of corresponding sizes of claim 1, wherein the top fixed electrode extension wall and the bottom fixed electrode extension wall are symmetrically disposed with respect to the mass.

4. The MEMS device having differential capacitors of corresponding sizes of claim 1, wherein the mass is disposed between the top fixed electrode extension wall and the bottom fixed electrode extension wall, or the top fixed electrode extension wall and the bottom fixed electrode extension wall are disposed inside the mass.

5. The MEMS device having differential capacitors of corresponding sizes of claim 1, wherein the MEMS device comprises a plurality of top fixed electrode extension walls and a plurality of bottom fixed electrode extension walls.

6. The MEMS device having differential capacitors of corresponding sizes of claim 5, wherein the top fixed electrode extension walls and the bottom fixed electrode extension walls are disposed at at least two opposite sides with respect to the mass, and each of the opposite sides is provided with at least one top fixed electrode extension wall and at least one bottom fixed electrode extension wall.

7. The MEMS device having differential capacitors of corresponding sizes of claim 1, wherein the upper end of the top fixed electrode extension wall includes at least one anchor for connecting to the top fixed electrode, and the upper end of the bottom fixed electrode extension wall includes at least one flange extending to a same elevation level as the anchor.

8. The MEMS device having differential capacitors of corresponding sizes of claim 7, wherein from a top view, the MEMS device includes a plurality of anchors and a plurality of flanges which are disposed at two opposite sides with respect to the mass, one anchor facing one flange.

9. The MEMS device having differential capacitors of corresponding sizes of claim 7, wherein from a top view, the MEMS device includes a plurality of anchors and a plurality of flanges which are disposed at two opposite sides with respect to the mass, and a total area of the anchor or anchors disposed at one of the two opposite sides is substantially equal to a total area of the anchor or anchors disposed at the other of the two opposite sides, or a total area of the flange or flanges disposed at one of the two opposite sides is substantially equal to a total area of the flange or flanges disposed at the other of the two opposite sides, or a total area of the anchors is substantially equal to a total area of the flanges.

* * * * *